US008080728B2

(12) United States Patent
Lenges

(10) Patent No.: US 8,080,728 B2
(45) Date of Patent: Dec. 20, 2011

(54) MULTILAYER COMPOSITE FILMS AND ARTICLES PREPARED THEREFROM

(75) Inventor: Geraldine M. Lenges, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 12/365,627

(22) Filed: Feb. 4, 2009

(65) Prior Publication Data

US 2009/0145475 A1 Jun. 11, 2009

(51) Int. Cl.
*H01L 31/048* (2006.01)
(52) U.S. Cl. .......... 136/251; 136/244; 136/259; 438/64; 438/66
(58) Field of Classification Search .................. 136/251; 428/35.7
See application file for complete search history.

(56) References Cited

U.S. PATENT DOCUMENTS

| | | | |
|---|---|---|---|
| 4,082,877 | A | 4/1978 | Shadle |
| 5,387,470 | A | 2/1995 | Parnell et al. |
| 5,478,402 | A | 12/1995 | Hanoka |
| 5,741,370 | A | 4/1998 | Hanoka |
| 5,846,620 | A * | 12/1998 | Compton ............ 428/35.7 |
| 6,093,757 | A | 7/2000 | Pern |
| 6,114,046 | A * | 9/2000 | Hanoka ............ 428/515 |
| 6,187,448 | B1 | 2/2001 | Hanoka et al. |
| 6,951,683 | B2 | 10/2005 | Blackwell |
| 2002/0038664 | A1 | 4/2002 | Zenko et al. |
| 2003/0000568 | A1 | 1/2003 | Gonsiorawski |
| 2003/0021930 | A1 | 1/2003 | Mientus et al. |
| 2005/0279401 | A1 | 12/2005 | Arhart et al. |
| 2008/0169023 | A1 | 7/2008 | Nishijima et al. |
| 2008/0207834 | A1 | 8/2008 | Arhart |
| 2009/0023867 | A1 | 1/2009 | Nishijima et al. |
| 2009/0120489 | A1 | 5/2009 | Nishijima et al. |

FOREIGN PATENT DOCUMENTS

| | | |
|---|---|---|
| JP | 5916388 | 1/1983 |
| JP | 5817685 | 2/1983 |
| JP | 294574 | 4/1990 |
| JP | 06-322334 A | 11/1994 |
| JP | 08-316508 A | 11/1996 |
| JP | 11-026791 A | 1/1999 |
| JP | 2000-186114 A | 7/2000 |
| JP | 2001-038862 | 2/2001 |
| JP | 2001-089616 A | 4/2001 |
| JP | 2001-119047 A | 4/2001 |
| JP | 2001-119056 A | 4/2001 |
| JP | 2001-119057 A | 4/2001 |
| JP | 2001144313 A | 5/2001 |
| JP | 2004-031445 A | 1/2004 |
| JP | 2005-034913 | 2/2005 |
| JP | 2005-064266 | 3/2005 |
| JP | 2008-064268 | 3/2005 |
| JP | 2005-126708 A | 5/2005 |
| JP | 2005-129925 A | 5/2005 |
| JP | 2005-129926 A | 5/2005 |
| JP | 2006-032308 A | 2/2006 |
| JP | 2006-036874 A | 2/2006 |
| JP | 2006-036875 A | 2/2006 |
| JP | 2006-036876 A | 2/2006 |
| JP | 2006-159497 A | 6/2006 |
| JP | 2006-186233 A | 7/2006 |
| JP | 2006-186237 A | 7/2006 |
| JP | 2006-190865 A | 7/2006 |
| JP | 2006-190867 A | 7/2006 |
| WO | 99/64239 | 12/1999 |
| WO | 2006/085603 A1 | 8/2006 |
| WO | 2006/095762 A1 | 9/2006 |
| WO | 2006/095911 A1 | 9/2006 |
| WO | 2007/149969 A2 | 12/2007 |

OTHER PUBLICATIONS

Richard W. Rees, "Ionic Bonding in Thermoplastic Resins", DuPont Innovation, 1971,2(2), pp. 1-4.
Richard W. Rees, "Physical Properties and Structural Features of Surlyn® Ionomer Resins", Polyelectrolytes, 1976, C, 177-197.
International Search Report for PCT/US2005/044601 dated May 3, 2006.
F. J. Pern and A. W. Czanderna, "Characterization of ethylene vinyl acetate (EVA) encapsulant: Effects of thermal processing and weathering degradation on its discoloration", Solar Energy Materials and Solar Cells (1992).
English Language Abstract of JP 2001-038862.

* cited by examiner

*Primary Examiner* — Jennifer Michener
*Assistant Examiner* — Jayne Mershon
(74) *Attorney, Agent, or Firm* — Kevin S. Dobson; Mark D. Kuller

(57) ABSTRACT

The present invention is an optically transparent laminate film comprising: at least three layers of film, wherein at least two of the at least three layers comprise ionomeric films, and wherein the film can be suitable for use in a photovoltaic cell or in packaging.

48 Claims, No Drawings

MULTILAYER COMPOSITE FILMS AND ARTICLES PREPARED THEREFROM

This application claims the priority from U.S. patent application Ser. No. 11/296,138, filed Dec. 7, 2005, which claims priority from U.S. Provisional Patent Application No. 60/634,421, filed Dec. 7, 2004.

BACKGROUND OF THE INVENTION

1. Field of the Invention

This invention relates to laminate films useful in packaging in general and as encapsulants in photovoltaic modules in particular. The invention particularly relates to transparent packaging films comprising ethylene acid copolymer ionomers.

2. Description of the Related Art

Good optical properties are important in packaging materials in general and solar cell modules in particular because good performance requires that light incident to the cell be transmitted efficiently and effectively to the voltage-generating layer. Poor light transmission reduces the efficiency and/or productivity of the photovoltaic generation process.

For example, a common form of solar cell module is made by interconnecting individually formed and separate solar cells made for example of crystalline silicon, and then mechanically supporting and protecting the cells against environmental degradation by integrating the cells into a laminated solar cell module. The laminated modules usually comprise a stiff transparent protective front panel or sheet, and a rear panel or sheet typically called a "backskin". Disposed between the front and back sheets so as to form a sandwich arrangement are the interconnected solar cells and an encapsulant.

A necessary requirement of the encapsulant (or at least that portion thereof that extends between the front sides of the cells and the transparent front panel) is that it be transparent to solar radiation. The typical mode of forming the laminated module is to assemble a sandwich comprising in order: a transparent panel, e.g., a front panel made of glass or a transparent polymer, a front layer of at least one sheet of encapsulant, an array of solar cells interconnected by electrical conductors (with the front sides of the cells facing the transparent panel), a back layer of at least one sheet of encapsulant, and a backskin or back panel, and then bonding those components together under heat and pressure using a vacuum-type laminator. The back layer of encapsulant may be transparent or any other color, and prior art modules have been formed using a backskin consisting of a thermoplastic or thermosetting polymer, glass or some other material.

A further requirement of the encapsulant is dimensional stability. In order to avoid potentially damaging stresses on the silicon cell, the encapsulant and surrounding structure should be stable to the temperature fluctuations that are found in end-use locations of the module.

A large number of materials have been used or considered for use as the encapsulant in modules made up of individual silicon solar cells. Ethylene vinyl acetate copolymer (commonly known as "EVA") is commonly used as an encapsulant for modules comprising crystalline silicon solar cells. However, EVA may have certain limitations or deficiencies, such as its tendency to discolor. Also, it can decompose and release acetic acid. EVA also can require cross-linking—for example as described in U.S. Pat. No. 6,093,757—to impart dimensional stability. Cross-linking is a potential source of variability in the product, and can promote subsequent oxidation and degradation of EVA. In addition, EVA must be laminated in a vacuum when making a module because of the presence of peroxide as a cross-linking promoter in the EVA. EVA used as an encapsulant material usually contains 33% (by weight) of vinyl acetate, and thus is a very soft and tacky material that makes handling EVA in a manufacturing environment somewhat troublesome.

The use of ionomer as an encapsulant is described in U.S. Pat. No. 5,478,402, hereby incorporated herein in its entirety by reference. The use of ionomer as an encapsulant is further disclosed in U.S. Pat. No. 5,741,370. The term "ionomer" and the type of resins identified thereby are well known in the art, as evidenced by Richard W. Rees, "Ionic Bonding In Thermoplastic Resins", DuPont Innovation, 1971, 2(2), pp. 1-4, and Richard W. Rees, "Physical Properties And Structural Features Of Surlyn® Ionomer Resins", Polyelectrolytes, 1976, C, 177-197. Ionomers may be formed by partial neutralization of ethylene-methacrylic acid copolymers or ethylene-acrylic acid copolymers with organic bases having cations of elements from Groups I, II, or III of the Periodic Table, notably, sodium, zinc, aluminum, lithium, magnesium and barium. Surlyn® ionomers have been identified as copolymers of ethylene and methacrylic or acrylic acid that typically have a melting point in the range of 83-95° C.

It can be desirable to provide materials that are useful as encapsulant materials in photovoltaic cells, wherein cross-linking is not required for acceptable dimensional stability of the encapsulant material.

SUMMARY OF THE INVENTION

The present inventors have made the surprising discovery that one or more physical properties of a polymer can be significantly improved when the polymer is sandwiched as a core layer in a laminate between ionomer layers.

In one aspect, the present invention is a laminate comprising: at least three polymeric layers which include
(1) two outer polymeric layers that are ionomeric polymers, and
(2) at least one core layer unit;
wherein each of the outer layers is in direct contact with opposing surfaces of at least one surface of a core layer unit, and wherein the at least one core layer unit is a single or multiple layer polymeric film or sheet that comprises at least one non-ionomeric polymer layer and wherein the optical clarity, as measured by the transmittance, and the dimensional stability of the laminate are each respectively enhanced over the expected values of said properties for the individual laminate layers.

In another aspect, the present invention is a laminate comprising:
(i) a first outer layer comprising a first ionomer;
(ii) a core layer unit comprising at least one polymer layer positioned such that a first surface of the core layer unit is in direct contact with at least one surface of the first outer layer;
(iii) a second outer layer comprising a second ionomer positioned such that a second surface of the core layer unit is in direct contact with at least one surface of the second outer layer;
wherein the at least one core layer polymer is a non-ionomeric polymer and wherein the individual optical transmittance for each of the first ionomer layer, the second ionomer layer, the core layer unit, and the laminate at the same wavelength can each be measured, and wherein the measured transmittance for the laminate is greater than the expectation value of the transmittance calculated from the transmittance of the three individual layers in their non laminated state weighted by their thicknesses in the laminate.

In another aspect, the present invention is a solar cell module comprising an encapsulant comprising:
(i) a first outer layer comprising a first ionomer;
(ii) a core layer unit comprising at least one polymer layer positioned such that a first surface of the core layer unit is in direct contact with at least one surface of the first outer layer;
(iii) a second outer layer comprising a second ionomer positioned such that a second surface of the core layer unit is in direct contact with at least one surface of the second outer layer;
wherein the at least one core layer polymer is a non-ionomeric polymer and wherein the individual optical transmittance for each of the first ionomer layer, the second ionomer layer, the core layer unit, and the laminate at the same wavelength can each be measured, and wherein the measured transmittance for the laminate is greater than the expectation value of the transmittance calculated from the transmittance of the three individual layers in their non laminated state weighted by their thicknesses in the laminate.

In another aspect, the present invention is a plurality of interconnected solar cells comprising an encapsulant comprising;
(i) a first outer layer comprising a first ionomer;
(ii) a core layer unit comprising at least one polymer layer positioned such that a first surface of the core layer unit is in direct contact with at least one surface of the first outer layer;
(iii) a second outer layer comprising a second ionomer positioned such that a second surface of the core layer unit is in direct contact with at least one surface of the second outer layer;
wherein the at least one core layer polymer is a non-ionomeric polymer and wherein the individual optical transmittance for each of the first ionomer layer, the second ionomer layer, the core layer unit, and the laminate at the same wavelength can each be measured, and wherein the measured transmittance for the laminate is greater than the expectation value of the transmittance calculated from the transmittance of the three individual layers in their non laminated state weighted by their thicknesses in the laminate.

DETAILED DESCRIPTION OF THE INVENTION

In one embodiment, the present invention is a laminate article having (a) outer layers that comprise ionomeric polymers and (b) a core layer unit that is disposed between the outer layers and comprises a non ionomeric polymer. In a laminate of the present invention the measured optical and/or dimensional stability of the laminate can be enhanced over the expected value of either or both said properties for the individual layers of the laminate.

By "expectation value" of a property it is meant the predicted value of said laminate property as calculated from the individual layers of the laminate, taking into account the layer thickness weighted average. By way of illustration, a three layer laminate wherein each layer has an optical extinction coefficient would be expected to have an absorbance that is the layer thickness weighted sum of the individual extinction coefficients. Similarly a three layer laminate where each layer has a tensile modulus would be expected to have a tensile modulus that is a layer thickness weighted average of the individual layers.

A laminate, as the term is used herein, comprises multiple polymer layers in face to face relationship among each other, wherein the adhesion between the layers is such that the layers remain adhered together during the application of such stresses as the structure is subjected to during normal or intended use of said laminate. Adhesion can be accomplished by the use of polymers in the different layers that adhere to each other during the manufacture of the material, or by the use of additional adhesives or primers.

The outer layers of the present invention are structural layers of a laminate of the present invention that are positioned so that they are in direct contact with a core layer unit on at least one surface of said core layer unit. The outer layers of a laminate of the present invention contribute to good optical properties in a laminate of the present invention. The outer layers of a laminate of the present invention comprise ionomeric polymers (ionomers). The outer layers each can comprise the identical ionomer composition to one another or can be different ionomer compositions from one another. Ionomers useful in the practice of the present invention are copolymers obtained by the copolymerization of ethylene and an ethylenically unsaturated $C_3$-$C_8$ carboxylic acid. Preferably the unsaturated carboxylic acid is either acrylic acid or methacrylic acid. The acid copolymer preferably includes from about 8 wt % to about 25 wt % of the acid, based on the total weight of the copolymer. Ionomers useful as optical layers in the practice of the present invention preferably comprise from about 11 wt % to about 25 wt % acid, more preferably from about 14 wt % to about 19 wt % acid, and most preferably from about 15 wt % to about 19 wt % acid.

Ionomers suitable for use herein can include a third comonomer component which is an ester of an ethylenically unsaturated $C_3$-$C_8$ carboxylic acid. The alkyl substituent of the ester can preferably be derived from a $C_1$ to $C_{12}$ alcohol, but any unsaturated ester that can provide the optical properties described herein can be suitable for use in the practice of the present invention. Conventional ionomers that include a third comonomer are commercially available from E.I. du Pont de Nemours and Company, for example, and can be suitable for use in the practice of the present invention so long as the optical and physical properties are suitable for application in the present invention.

A core layer unit of the present invention is a structural component within a laminate of the present invention that is in direct contact with at least one outer layer on at least one surface of the at least one outer layer. The core layer unit of the present invention provides properties to the laminate that are not provided by the outer layers alone. For example, the core layer can provide higher or lower modulus, barrier properties, strength, absorbancy, permeability, or other properties desirable in a package or other article.

The core layer unit can itself be a single polymeric layer, or a laminated polymeric structure, or multiple plied layers of film and/or sheet. Any layer included or used in a core layer unit of the present invention is, for the purposes herein, considered a core layer. A core layer suitable for use herein can comprise any polymer that imparts desirable properties to the laminate. For example, the core layer can be polyurethane, ethylene vinyl acetate (EVA), polyvinyl chloride (PVC), polyester, polyacetals, ethylene acid copolymers (which can be inclusive of ethylene acid terpolymers or higher copolymers), ethylene acrylate copolymers (which can be inclusive of terpolymers and higher copolymers), or other polymeric layers that have suitable physical properties and can be laminated to an ionomer to yield a multilayer film either directly or through a tie or adhesive layer. A laminate of the present invention can comprise more than one core layer unit.

In another embodiment, the present invention is an optically transparent multilayer laminate film structure comprising at least three film layers. By optically transparent it is meant that optical measurements taken on the combination of the at least three layers of the multilayer film structure are at least 85% transparent to light in the visible region of the light spectrum. Optical transparency can be related to the haze of the multilayer laminate film. In the practice of the present invention, the haze of the multilayer laminate structure is not greater than 6%.

A optically transparent laminate of the present invention is constructed such that the outer layers contact the core layer and form an interface with opposing surfaces of the at least one core layer.

While the laminate structure of the present invention transmits at least about 85% of the incident light, and/or has a haze of less than about 6%, the individual components of the laminate are not required to have optical properties that meet those standards. In particular, the at least one core layer of the present invention is not required to have optical properties which meet the minimum optical standards of the laminate. In fact, it is one object of the present invention to overcome relatively poor optical properties in a core layer component by combining core structural layer(s) with outer layers, or optical layers, of the present invention described herein, thereby providing a laminate having acceptable optical properties.

In another embodiment, an optically transparent multilayer laminate of the present invention comprises: (1) at least two ionomeric outer layers having independently transparency of at least about 85% and/or a haze value of less than about 6%, and (2) at least one core layer that provides other desirable properties not provided by the optical layers but having a transparency of less than about 85% and/or a haze of greater than about 6% when taken alone and not in a laminate with the outer layers.

The outer layers can each independently transmit at least about 85% of incident light. Preferably the outer layers transmit at least about 88% of incident light, and more preferably at least about 89% of the incident light. Most preferably the outer layers transmit at least about 90% of incident light. In a much preferred embodiment the outer layers can each independently transmit at least about 91%, 92%, 93%, 94%, 95% or more of incident light. The haze of the outer layers is preferably less than about 5%, more preferably less than about 4%, and most preferably less than about 3%. In a particularly preferred embodiment of the present invention, the haze of the outer layers is less than about 2%, and can be as low as 1% or less, and light transmission can be at least 98% or even 99% or more.

In the practice of the present invention the outer layers of the multilayer film are chemically distinct from the at least one core layer and can be chemically distinct from each other. To illustrate by way of example, the percentage of the acid component in the ionomer can vary between the at least two of the ionomer layers, as can the level of neutralization of the acid components, as can the identity of the counterion present in the at least two ionomers, as can the presence or absence of a third comonomer. Each of these conditions, and others, can be varied independently or in combination to make the outer layers chemically distinct from the core layer and/or from each other. It can be preferable, for reasons of cost or to reduce complexity, that the outer layers are identical to each other.

In a preferred embodiment of the present invention a laminate of the present invention has a transition temperature as measured by DMA (and described hereunder in the examples) of 65° C. or more at 1 Hz. More preferably, the transition temperature of the material is greater than about 65° C. and that of the core layer alone is 40° C. or less at 1 Hz.

A transparent multilayer film of the present invention can be suitable for use as an interlayer in a laminate glazing system such as: a vehicle windshield or sidelite; as safety glass in buildings; cabinet glass; glazing in doors; shelving; laminated glazing in other conventional applications.

A multilayer film of the present invention surprisingly exhibits superior optical properties compared to the core layer alone, and the outer layers provide other physical properties to the multilayer film. This result is surprising because the optical layers can provide desirable optical properties in spite of poor optical properties of the core layer(s).

The multilayer laminate of the present invention has a total thickness 40.0 mil or less. Preferably, the laminate can have a total thickness of 20.0 or less. More preferably, the laminate can have a total thickness of 10.0 mil or less, and even more preferably a thickness of 4.0 mil or less. Even more preferably, the laminate can have a total thickness of about 3.0 mil or less, or 2.0 mil or less. The thickness required of a multilayer film can be a balance between obtaining structural properties required to protect the contents of a package, for example, and achieving other goals such as meeting optical requirements of transparency, using cost-effective materials, and/or minimizing production costs.

The outer layers of the present invention can be thinner than the core layers of the present invention, but this may not be a requirement in all applications of the present invention. The thickness of the outer layer(s) can each independently be about 50% or less of the thickness of the outer layer. The outer layers of a laminate of the present invention can each independently have a thickness of 20.0 mil or less, preferably 15 mil or less, and more preferably 10 mil or less, with the proviso that any film thickness can be varied to balance the desirable optical and other physical properties, with the practical aspects of producing a cost-effective film.

A multilayer laminate film of the present invention can be useful in a variety of applications and can be suitable for use in combination with glass, or clear plastic, to make optically clear or transparent laminate articles such as solar cell modules, or laminated windows, or other safety glass, or plastic bottles, or squeezable bottles.

In another embodiment, the present invention is a photovoltaic cell in which a light sensitive silicon device is disposed against one of the ionomer comprising layers of the multilayer laminate ("the first layer") wherein the outer layers comprise ionomers and an inner, core, layer comprises a non ionomeric polymer. The light sensitive portion of the silicon device faces the three layer laminate. The other surface of the silicon device is disposed against a second layer that may comprise a second three layer laminate, or any polymer that can form a seal against the first layer. The second layer may also comprise a backsheet layer, and the backsheet layer can be laminated with the second layer or separate therefrom.

In a preferred embodiment the invention is a solar cell module comprising at least one solar cell which in turn comprises a transparent encapsulant material positioned adjacent to at least one surface of the solar cell. The encapsulant material comprises a laminate material further comprising:
(i) a first outer layer comprising a first ionomer;
(ii) a core layer unit comprising at least one polymer layer positioned such that a first surface of the core layer unit is in direct contact with at least one surface of the first outer layer;
(iii) a second outer layer comprising a second ionomer positioned such that a second surface of the core layer unit is in direct contact with at least one surface of the second outer layer;
wherein the at least one core layer polymer is a non-ionomeric polymer and wherein the individual optical transmittance for each of the first ionomer layer, the second ionomer layer, the core layer unit, and the laminate at the same wavelength can each be measured, and wherein the measured transmittance for the laminate is greater than the expectation value of the transmittance calculated from the transmittance of the three individual layers in their non laminated state weighted by their thicknesses in the laminate.

A module of the present invention further comprises a front support layer formed of light transmitting material disposed adjacent a front surface of the encapsulant material and a backskin layer disposed adjacent a rear surface of the encapsulant material.

The solar cell module can further comprise at least one solar cell that in turn comprises a plurality of interconnected solar cells.

In another embodiment, the present invention is a laminate that comprises outer layers that in turn comprise ionomers, and a core layer that is disposed between the outer layers and comprises a non ionomeric polymer such that the phase transition temperature of the laminate is enhanced over what would be expected from the individual laminate layers alone. It is possible for the laminated structure to have a DMA phase transition temperature under dynamic mechanical analysis that is higher than the phase transition temperature of the material from which the core material is fabricated. The enhanced transition temperature yields a material which is dimensionally stable at ambient temperatures. Optionally the laminates of this embodiment have optical transparency, however this embodiment of the invention is not limited to transparent laminates.

EXAMPLES

The Examples and Comparative Examples are presented for illustrative purposes only, and are not intended to limit the scope of the present invention in any manner.

In the following experiments cast film was made on a Sano multi-layer extrusion line. The total structure of thickness 460 microns structure comprised of 25 micron thick identical Surlyn® 1705-1 (Du Pont, Wilmington, Del.) outer layers bounding a 410 micron thick core layer comprising a second resin.

Secant Modulus was measured on film samples (Instru-Met load frame 1122 tensile tester using ASTM D 882-01)

% Haze was measured on film samples (BYK Gardner haze-gard plus using ASTM D 1003-00)

% Transmittance was measured on film samples (Varian Cary 5 uv/vis/nir, System I.D. Cary5-1081139 scanned from 800 nm to 200 nm and reported at 500 nm). The expectation value of the transmittance was calculated as the layer thickness weighted value calculated from the absorbance per unit thickness of the materials that each layer comprised.

Dynamic mechanical analysis (DMA) was conducted in order to ascertain the dimensional stability of the samples. The experiments were run on a Seiko DMS 210 in tensile mode from ambient to 150° C. at 1° C./min heating rate, 1 Hz frequency and 10 μm amplitude. By "DMA transition" is meant the temperature at which the gradient of the length of the specimen vs temperature plot sharply changes direction, indicating either shrinkage or expansion of the sample, that is a lack of dimensional stability (dimensional instability), at the given temperature.

In the following examples, Elvaloy® 1330 is ethylene-methyl acrylate copolymer with 30% MA and 3 melt index (MI). Elvaloy® 1335 is ethylene-methyl acrylate copolymer with 35% MA and 3 MI. Elvaloy® 3427 is ethylene-butyl acrylate copolymer with 27% BA and 4 MI. Surlyn® 1705-1 is a 5.5 MI, zinc-neutralized ethylene-methacrylic acid copolymer and Surlyn® 1857 is a 4 MI, zinc-neutralized ethylene-methacrylic acid-isobutyl acrylate terpolymer.

| DMA Data | |
|---|---|
| Control Samples | |
| Film Composition | Observed DMA Transition (° C.) |
| S1705 | 82 |
| S1857 | NM |
| E1335 | 33 |
| E1330 | 35 |
| E3427 | 38 |
| Laminate Samples | |
| Film Composition | Observed Transition |
| S1705/E1330/S1705 | 78 |
| S1705/E1335/S1705 | 75 |
| S1705/E3427/S1705 | 74 |

NM = Not Measured.

DMA data at 1 Hz from 0° C.-150° C. indicate that having a thin laminate of Surlyn® (1-mil) outside an EMA core (16-mil) provides dimensional stability of the multi-layer structure at from ambient temperatures up to more than 70° C. with results almost equivalent to the mono-layer Surlyn® 1705-1.

| Optical and Tensile Data | | | |
|---|---|---|---|
| Control samples | | | |
| Film Composition | Observed Transmittance (%) | Observed MD Secant Modulus (psi) | TD Modulus (psi) |
| S1705 | 90.5 | 29459 | 26930 |
| S1857 | 89.4 | NM | NM |
| E1335 | 37.3 | 992 | 744 |
| E1330 | 34.1 | 1727 | 1458 |
| E3427 | 75.7 | 3310 | 3310 |
| Laminate samples | | | |
| Film Composition | Expectation Transmittance (%) | Observed Transmittance (%) | |
| S1705/S1875/S1705 | 89.4 | 89.7 | |
| S1705/E1330/S1705 | 38.0 | 88.1 | |
| S1705/E1335/S1705 | 41.2 | 85.1 | |
| S1705/E3427/S1705 | 77.2 | 88.1 | |

| Tensile Data (Secant Modulus) | | | | |
|---|---|---|---|---|
| Film Composition | Expected MD modulus (psi) | Observed MD Modulus (psi) | Expected TD modulus (psi) | Observed TD Modulus (psi) |
| S1705/E1330/S1705 | 4808 | 4733 | 4288 | 5071 |
| S1705/E1335/S1705 | 4155 | 4320 | 3654 | 4846 |
| S1705/E3427/S1705 | 6215 | 7498 | 5934 | 7729 |

The transparency of tri-layer structures is improved over monolayer Elvaloy® AC films, however the advantages of the low modulus of the EMA is retained, while the dimensional stability as measured by the DMA transition) of tri-layer structure is also significantly improved over monolayer Elvaloy® AC films. The need for cross linking of the core layer is obviated.

The present invention has been described with regard to certain embodiments and examples. However one skilled in the art will be able with obvious modifications to modify the invention. The scope of the invention as claimed is intended to include all such modifications and is not to be construed to be limited to the examples and embodiments described herein.

What is claimed is:

1. A solar cell module prepared from a sandwich comprising:
   (a) at least one solar cell,
   (b) a transparent encapsulant material disposed adjacent to at least one surface of the solar cell which comprises a laminate article comprising:
      (i) a first outer layer comprising a first ionomer;
      (ii) a core layer unit comprising at least one polymer layer positioned such that a first surface of the core layer unit is in direct contact with at least one surface of the first outer layer;
      (iii) a second outer layer comprising a second ionomer positioned such that a second surface of the core layer unit is in direct contact with at least one surface of the second outer layer;
         (A) wherein the at least one core layer polymer is a non-ionomeric polymer selected from the group consisting of: ethylene acid copolymers, ethylene acrylate copolymers and blends thereof, and
         (B) wherein the measured transmittance at 500 nm for the laminate is greater than the expectation value of the transmittance calculated from the transmittance of the three individual layers in their non laminated state weighted by their thicknesses in the laminate,
   (c) a front support layer formed of light transmitting material, and
   (d) a backskin layer,
   wherein the at least one solar cell and transparent encapsulant material are disposed between the front support layer and the backskin layer.

2. The solar cell module of claim 1 wherein the first and second ionomers comprise identical compositions.

3. The solar cell module of claim 1 wherein the optical transmittance of the laminate material of light of 500 nm wavelength is greater than 85%.

4. The solar cell module of claim 1 wherein the laminate article shows a DMA transition temperature of greater than 65° C. at 1 Hz.

5. The solar cell module of claim 4 wherein the core layer polymer shows a DMA transition temperature of less than 40° C. at 1 Hz when not laminated to the outer layers.

6. The solar cell module of claim 1 wherein the core layer polymer is a laminate.

7. The solar cell module of claim 1 wherein the first and second ionomers independently comprise copolymers obtained by the copolymerization of ethylene and an ethylenically unsaturated $C_3$-$C_8$ carboxylic acid.

8. The solar cell module of claim 1 wherein the first and second ionomers independently are ionomer copolymers obtained by the copolymerization of ethylene and from about 8 wt % to about 25 wt % of ethylenically unsaturated $C_3$-$C_8$ carboxylic acid, based on the total weight of the copolymer.

9. The solar cell module of claim 1 wherein the first and second ionomers independently are ionomer copolymers obtained by the copolymerization of ethylene and from about 14 wt % to about 19 wt % of acrylic acid or methacrylic acid, based on the total weight of the copolymer.

10. The solar cell module of claim 1 comprising a plurality of interconnected solar cells.

11. A solar cell module prepared from a sandwich comprising:
   (a) at least one solar cell,
   (b) a transparent encapsulant material disposed adjacent to at least one surface of the solar cell which comprises a laminate article comprising:
      (i) a first outer layer that comprises a first ionomer;
      (ii) a core layer unit comprised of at least one core layer polymer located with a first surface next to a surface of the first outer layer; and
      (iii) a second outer layer that comprises a second ionomer located next to a second surface of the core layer unit,
      wherein the core layer polymer is selected from the group consisting of: ethylene acid copolymers, ethylene acrylate copolymers and blends thereof, and
      wherein the value of the transition temperature under tensile conditions at 1 Hz by DMA for the laminate material is greater than the value of the transition temperature under tensile conditions at 1 Hz by DMA of the core layer polymer measured under identical conditions and not in the laminate,
   (c) a front support layer formed of light transmitting material, and
   (d) a backskin layer disposed,
   wherein the at least one solar cell and transparent encapsulant material are disposed between the front support layer and the backskin layer.

12. The solar cell module of claim 11 wherein the first and second ionomers are the same.

13. The solar cell module of claim 12 wherein the laminate article has a DMA transition temperature of greater than 65° C. at 1 Hz.

14. The solar cell module of claim 13 wherein the core layer polymer has a DMA transition temperature of less than 40° C. at 100 Hz when not laminated to the outer layers.

15. The solar cell module of claim 11 wherein the first and second ionomers independently comprise copolymers obtained by the copolymerization of ethylene and an ethylenically unsaturated $C_3$-$C_8$ carboxylic acid.

16. The solar cell module of claim 15 wherein the first and second ionomers independently comprise copolymers obtained by the copolymerization of ethylene and from about 8 wt % to about 25 wt % of ethylenically unsaturated $C_3$-$C_8$ carboxylic acid, based on the total weight of the copolymer.

17. The solar cell module of claim 16 wherein the first and second ionomers independently are ionomer copolymers obtained by the copolymerization of ethylene and about 14 wt % to about 19 wt % of acrylic acid or methacrylic acid, based on the total weight of the copolymer.

18. A solar cell module prepared from a sandwich comprising:
   (a) a front support layer formed of light transmitting material,
   (b) at least one solar cell,
   (c) a transparent encapsulant laminate positioned adjacent to at least one surface of the solar cell(s), and
   (d) a backskin layer,
   wherein the transparent encapsulant laminate comprises:
      (A) two outer films layers of ionomer copolymer obtained by the copolymerization of ethylene and an about 8 wt % to about 25 wt % of ethylenically unsaturated $C_3$-$C_8$ carboxylic acid, based on the total weight of the copolymer, and
      (B) at least one layer of polymer selected from the group consisting of ethylene acid copolymers, ethylene acrylate copolymers and blends thereof, between the outer films layer of ionomer copolymer.

19. The solar cell module of claim 18 wherein the polymer is selected from the ethylene acid copolymers.

20. The solar cell module of claim 18 wherein polymer is selected from the ethylene acrylate copolymers.

21. The solar cell module of claim 18 wherein the ionomer copolymer is obtained by the copolymerization of ethylene and from about 14 wt % to about 19 wt % of acrylic acid or methacrylic acid, based on the total weight of the copolymer.

22. The solar cell module of claim 18 wherein the front support layer is glass.

23. The solar cell module of claim 18 wherein the transparent encapsulant laminate has a total thickness 40.0 mil or less.

24. The solar cell module of claim 18 wherein the transparent encapsulant laminate has a total thickness 20.0 mil or less.

25. The solar cell module of claim 24 wherein (i) the encapsulant laminate is a three-layer structure wherein the at least one layer of polymer is a core layer of the polymer, (ii) the thickness of the outer films layers is each independently about 50% or less of the thickness of the core layer, and (iii) the ethylenically unsaturated $C_3$-$C_8$ carboxylic acid is selected from the group consisting of acrylic acid and methacrylic acid.

26. The solar cell module of claim 18 wherein the transparent encapsulant laminate has a total thickness of 10.0 mil or less.

27. The solar cell module of claim 26 wherein (i) the encapsulant laminate is a three-layer structure wherein the at least one layer of polymer is a core layer of the polymer, (ii) the thickness of the outer films layers is each independently about 50% or less of the thickness of the core layer, and (iii) the ethylenically unsaturated $C_3$-$C_8$ carboxylic acid is selected from the group consisting of acrylic acid and methacrylic acid.

28. The solar cell module of claim 1 wherein the transparent encapsulant laminate has a total thickness of 20.0 mil or less.

29. The solar cell module of claim 28 wherein (i) the encapsulant laminate is a three-layer structure wherein the at least one layer of polymer is a core layer of the polymer, (ii) the thickness of the outer films layers is each independently about 50% or less of the thickness of the core layer, and (iii) the ethylenically unsaturated $C_3$-$C_8$ carboxylic acid is selected from the group consisting of acrylic acid and methacrylic acid.

30. The solar cell module of claim 18 wherein (i) the ethylenically unsaturated $C_3$-$C_8$ carboxylic acid is either acrylic acid or methacrylic acid, (ii) the first transparent encapsulant laminate transmits at least about 85% of the incident light and/or has a haze of less than about 6%, and (iii) the at least one solar cell comprises a plurality of interconnected solar cells.

31. The solar cell module of claim 18 wherein (i) the ethylenically unsaturated $C_3$-$C_8$ carboxylic acid is either acrylic acid or methacrylic acid, (ii) the first transparent encapsulant laminate has a transition temperature as measured by DMA of 65° C. or more at 1 Hz, and (iii) the at least one solar cell comprises a plurality of interconnected solar cells.

32. The solar cell module of claim 18 wherein (i) the ethylenically unsaturated $C_3$-$C_8$ carboxylic acid is either acrylic acid or methacrylic acid, (ii) the first transparent encapsulant laminate transmits at least about 85% of the incident light and/or has a haze of less than about 6%, (iii) the first transparent encapsulant laminate has a transition temperature as measured by DMA of 65° C. or more at 1 Hz, (iv) the at least one solar cell comprises a plurality of interconnected solar cells, and (v) the front support layer is glass.

33. The solar cell module of claim 32 wherein the transparent encapsulant laminate has a total thickness of 20.0 mil or less.

34. The solar cell module of claim 26 wherein (i) the encapsulant laminate is a three-layer structure wherein the at least one layer of polymer is a core layer of the polymer, and (ii) the thickness of the outer films layers is each independently about 50% or less of the thickness of the core layer.

35. The solar cell module of claim 34 wherein the polymer is selected from the ethylene acid copolymers.

36. The solar cell module of claim 34 wherein polymer is selected from the ethylene acrylate copolymers.

37. A solar cell module prepared from a sandwich comprising in order:
(a) a front support layer formed of light transmitting material,
(b) a transparent encapsulant laminate,
(c) at least one solar cell,
(d) an encapsulant or seal layer, and
(e) a backsheet layer;
wherein the transparent encapsulant laminate comprises:
(A) two outer films layers of ionomer copolymer obtained by the copolymerization of ethylene and an about 8 wt % to about 25 wt % of ethylenically unsaturated $C_3$-$C_8$ carboxylic acid, based on the total weight of the copolymer, and
(B) at least one layer of polymer selected from the group consisting of ethylene acid copolymers, ethylene acrylate copolymers and blends thereof, between the outer films layer of ionomer copolymer.

38. The solar cell module of claim 37 wherein the polymer is selected from the ethylene acid copolymers.

39. The solar cell module of claim 37 wherein polymer is selected from the ethylene acrylate copolymers.

40. The solar cell module of claim 37 wherein the ionomer copolymer is obtained by the copolymerization of ethylene and from about 14 wt % to about 19 wt % of acrylic acid or methacrylic acid, based on the total weight of the copolymer.

41. The solar cell module of claim 37 wherein (i) the encapsulant laminate is a three-layer structure wherein the at least one layer of polymer is a core layer of the polymer, (ii) the thickness of the outer films layers is each independently about 50% or less of the thickness of the core layer, and (iii) the ethylenically unsaturated $C_3$-$C_8$ carboxylic acid is selected from the group consisting of acrylic acid and methacrylic acid.

42. The solar cell module of claim 41 wherein (1) the first transparent encapsulant laminate transmits at least about 85% of the incident light and/or has a haze of less than about 6%, and (ii) the at least one solar cell comprises a plurality of interconnected solar cells.

43. The solar cell module of claim 41 wherein (i) the first transparent encapsulant laminate has a transition temperature as measured by DMA of 65° C. or more at 1 Hz, and (ii) the at least one solar cell comprises a plurality of interconnected solar cells.

44. The solar cell module of claim 41 wherein (i) the first transparent encapsulant laminate transmits at least about 85% of the incident light and/or has a haze of less than about 6%, (ii) the first transparent encapsulant laminate has a transition temperature as measured by DMA of 65° C. or more at 1 Hz, (iii) the at least one solar cell comprises a plurality of interconnected solar cells, (iv) the front support layer is glass, (v) the transparent encapsulant laminate has a total thickness of 20.0 mil or less.

45. A solar cell module prepared from a sandwich comprising in order:

(a) a front support layer formed of light transmitting material,
(b) a first transparent encapsulant laminate,
(c) at least one solar cell,
(d) a second encapsulant laminate, and
(e) a backsheet layer;
wherein the first transparent encapsulant laminate and the second encapsulant laminate each comprise:
   (A) two outer films layers of ionomer copolymer obtained by the copolymerization of ethylene and an about 8 wt % to about 25 wt % of ethylenically unsaturated $C_3$-$C_8$ carboxylic acid, based on the total weight of the copolymer, and
   (B) at least one layer of polymer selected from the group consisting of ethylene acid copolymers, ethylene acrylate copolymers and blends thereof, between the outer films layer of ionomer copolymer.

46. The solar cell module of claim 45 wherein the polymer is selected from the ethylene acid copolymers.

47. The solar cell module of claim 45 wherein polymer is selected from the ethylene acrylate copolymers.

48. A solar cell module prepared from a sandwich comprising in order:
(a) a front support layer formed of light transmitting material,
(b) a transparent encapsulant laminate,
(c) at least one solar cell, and
(d) an encapsulant or seal layer, which also comprises a backsheet layer;
wherein the transparent encapsulant laminate comprises:
   (A) two outer films layers of ionomer copolymer obtained by the copolymerization of ethylene and an about 8 wt % to about 25 wt % of ethylenically unsaturated $C_3$-$C_8$ carboxylic acid, based on the total weight of the copolymer, and
   (B) at least one layer of polymer selected from the group consisting of ethylene acid copolymers, ethylene acrylate copolymers and blends thereof, between the outer films layer of ionomer copolymer.

\* \* \* \* \*